United States Patent
Jeter et al.

(10) Patent No.: US 10,083,736 B1
(45) Date of Patent: Sep. 25, 2018

(54) ADAPTIVE CALIBRATION SCHEDULING FOR A MEMORY SUBSYSTEM BASED ON CALIBRATIONS OF DELAY APPLIED TO DATA STROBE AND CALIBRATION OF REFERENCE VOLTAGE

(71) Applicant: Apple Inc., Cupertino, CA (US)

(72) Inventors: Robert E. Jeter, Santa Clara, CA (US); Rakesh L. Notani, Sunnyvale, CA (US); Fabien S. Faure, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/190,291

(22) Filed: Jun. 23, 2016

(51) Int. Cl.
  *G11C 7/00* (2006.01)
  *G11C 11/4076* (2006.01)
  *G11C 11/4096* (2006.01)
  *G11C 11/4091* (2006.01)

(52) U.S. Cl.
  CPC ...... *G11C 11/4076* (2013.01); *G11C 11/4091* (2013.01); *G11C 11/4096* (2013.01)

(58) Field of Classification Search
  CPC .................................. G11C 11/4076
  USPC ................................... 365/189.07
  See application file for complete search history.

(56) References Cited

U.S. PATENT DOCUMENTS

| 6,931,559 | B2 | 8/2005 | Burns | |
|---|---|---|---|---|
| 7,036,053 | B2* | 4/2006 | Zumkehr | G11C 7/1051 714/709 |
| 7,162,376 | B2 | 1/2007 | Oh et al. | |
| 7,405,984 | B2* | 7/2008 | Hughes | G11C 7/04 365/189.07 |
| 7,652,932 | B2* | 1/2010 | Millar | G11C 7/1078 365/185.2 |
| 8,233,336 | B2* | 7/2012 | Mueller | G06F 13/1694 365/189.07 |
| 8,582,374 | B2* | 11/2013 | Mozak | G11C 5/147 327/530 |
| 8,588,014 | B1* | 11/2013 | Fung | H03K 5/131 365/193 |

(Continued)

OTHER PUBLICATIONS

International Search Report and Written Opinion in application No. PCT/US2016/020191 dated Jun. 14, 2016.

*Primary Examiner* — Anthan Tran
*Assistant Examiner* — Mushfique Siddique
(74) *Attorney, Agent, or Firm* — Meyertons, Hood, Kivlin, Kowert & Goetzel, P.C.; Erik A. Heter

(57) ABSTRACT

A method and apparatus for adaptive calibration scheduling is disclosed. A calibration circuit may perform calibrations of a delay applied to a data strobe conveyed from a memory controller to the memory, and may also calibrate a reference voltage. After calibrating the data strobe delay, a current width of an eye opening and a current score are determined. If the eye opening is not less than a minimum threshold and the current score is within a specified range of a reference score, the reference voltage calibration, if conditionally scheduled, is inhibited. The results of the calibration may be recorded in a history table. A timer may advance a pointer provided to a sequence table at a rate determined by information stored in the history table. Information stored in an entry of the sequence table may indicate which calibration procedures are to be performed during the next calibration cycle.

17 Claims, 7 Drawing Sheets

(56) References Cited

U.S. PATENT DOCUMENTS

| | | | |
|---|---|---|---|
| 8,630,131 B1* | 1/2014 | Shiao | G11C 5/04 |
| | | | 326/30 |
| 9,209,961 B1* | 12/2015 | Notani | H03K 5/14 |
| 9,286,961 B1* | 3/2016 | Jeter | H03L 7/08 |
| 9,305,622 B1* | 4/2016 | Jeter | G11C 7/22 |
| 9,396,778 B1* | 7/2016 | Jeter | G11C 7/00 |
| 9,401,189 B1* | 7/2016 | Ding | G11C 29/022 |
| 9,436,387 B2* | 9/2016 | Jeter | G06F 3/0604 |
| 9,477,259 B2* | 10/2016 | Jeter | G06F 1/08 |
| 9,558,850 B1* | 1/2017 | Bialas, Jr. | G11C 11/401 |
| 9,620,184 B1* | 4/2017 | Bialas, Jr. | G11C 29/021 |
| 9,627,030 B1* | 4/2017 | Bialas, Jr. | G11C 11/4076 |
| 9,728,246 B2* | 8/2017 | Fujishiro | G11C 11/4076 |
| 2003/0154416 A1* | 8/2003 | LaBerge | G06F 13/1689 |
| | | | 713/400 |
| 2004/0123207 A1* | 6/2004 | Zumkehr | G11C 7/1051 |
| | | | 714/744 |
| 2006/0164909 A1* | 7/2006 | Gower | G11C 7/1048 |
| | | | 365/193 |
| 2007/0226529 A1* | 9/2007 | Huang | G06F 5/06 |
| | | | 713/401 |
| 2007/0288182 A1 | 12/2007 | Douriet | |
| 2008/0068911 A1* | 3/2008 | Hughes | G11C 7/04 |
| | | | 365/211 |
| 2008/0094918 A1* | 4/2008 | Fujizoe | G11C 7/106 |
| | | | 365/189.07 |
| 2008/0276133 A1* | 11/2008 | Hadley | G11C 7/1066 |
| | | | 714/56 |
| 2009/0034344 A1* | 2/2009 | Nguyen | G11C 7/1018 |
| | | | 365/189.07 |
| 2011/0075496 A1* | 3/2011 | Mueller | G06F 13/1694 |
| | | | 365/193 |
| 2011/0249522 A1* | 10/2011 | Welker | G11C 29/02 |
| | | | 365/194 |
| 2012/0005515 A1 | 1/2012 | Reddi | |
| 2012/0166839 A1 | 6/2012 | Sodhi | |
| 2013/0064025 A1* | 3/2013 | Chen | G06F 13/1689 |
| | | | 365/193 |
| 2013/0070363 A1 | 3/2013 | Bennett | |
| 2013/0076425 A1* | 3/2013 | Oh | G11C 7/1051 |
| | | | 327/263 |
| 2014/0181429 A1* | 6/2014 | Malladi | G06F 12/00 |
| | | | 711/154 |
| 2014/0229666 A1* | 8/2014 | Schoenborn | G11C 29/06 |
| | | | 711/105 |
| 2016/0034219 A1* | 2/2016 | Jeter | G06F 3/0625 |
| | | | 711/154 |
| 2016/0035411 A1* | 2/2016 | Yu | G11C 11/4091 |
| | | | 365/189.07 |
| 2016/0048334 A1* | 2/2016 | Jeter | G06F 3/0604 |
| | | | 711/163 |
| 2016/0118103 A1* | 4/2016 | Iljima | G11C 11/4076 |
| | | | 365/189.07 |
| 2016/0209866 A1* | 7/2016 | Jeter | G06F 1/12 |
| 2016/0292094 A1* | 10/2016 | Jeter | G06F 13/1668 |
| 2016/0351246 A1* | 12/2016 | Fujishiro | G11C 11/406 |

\* cited by examiner

US 10,083,736 B1

ADAPTIVE CALIBRATION SCHEDULING FOR A MEMORY SUBSYSTEM BASED ON CALIBRATIONS OF DELAY APPLIED TO DATA STROBE AND CALIBRATION OF REFERENCE VOLTAGE

BACKGROUND

Technical Field

This disclosure is directed to memory subsystems, and more particularly, calibration of signals conveyed in memory subsystems.

Description of the Related Art

Eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic zero or a logic 1.

In memory systems, calibrations may be performed to determine the points at which signals are sampled within the eye opening. Calibrations may be performed to determine both the point in time at which signals are sampled, as well as to determine the threshold voltage for distinguishing between logic zero's and logic 1's. The calibration to determine the point in time at which signals are sampled may be referred to as a horizontal calibration. The calibration to determine the threshold voltage may be referred as a vertical calibration. In many memory systems, these calibrations are performed at regular intervals, and typically, in conjunction with one another.

SUMMARY

A method and apparatus for adaptive calibration scheduling is disclosed. In one embodiment, a calibration circuit is configured to perform calibrations of a delay applied to a data strobe conveyed from a memory controller to the memory, and may also calibrate a reference voltage. After calibrating the data strobe delay, a current width of an eye opening and a current score are determined. If the eye opening is not less than a minimum threshold and the current score is within a specified range of a reference score, the reference voltage calibration, if conditionally scheduled, is inhibited. The results of the calibration may be recorded in a history table. A timer may advance a pointer provided to a sequence table at a rate determined by information stored in the history table. Information stored in an entry of the sequence table may indicate which calibration procedures are to be performed during the next calibration cycle.

In one embodiment, if the history table indicates that prescribed conditions were met for the most recent N calibration cycles, the timer may advance the pointer at a first rate. If the prescribed conditions were not met for one or more of the most recent N calibrations, the timer may advance the pointer at a second rate. The second rate is faster than the first rate. The prescribed conditions may include the current score being within the specified range of the reference score, and the eye opening meeting or exceeding a minimum width threshold. Calibration sequences, as indicated by entries in the sequence table, are performed with a periodicity that corresponds to the rate at which the pointer is advanced. Thus, calibration sequences are performed less frequently when the pointer is advanced at the first rate than when it is advanced at the second rate. The calibration sequences may include a conditional reference voltage calibration (determined based on the prescribed conditions), an unconditional reference voltage calibration, or no reference voltage calibration. Even if the reference voltage calibration is not conditionally scheduled, the comparisons of the current score and the width of the eye may be performed, and the corresponding results may be recorded in the history table.

BRIEF DESCRIPTION OF THE DRAWINGS

The following detailed description makes reference to the accompanying drawings, which are now briefly described.

Figure 1:
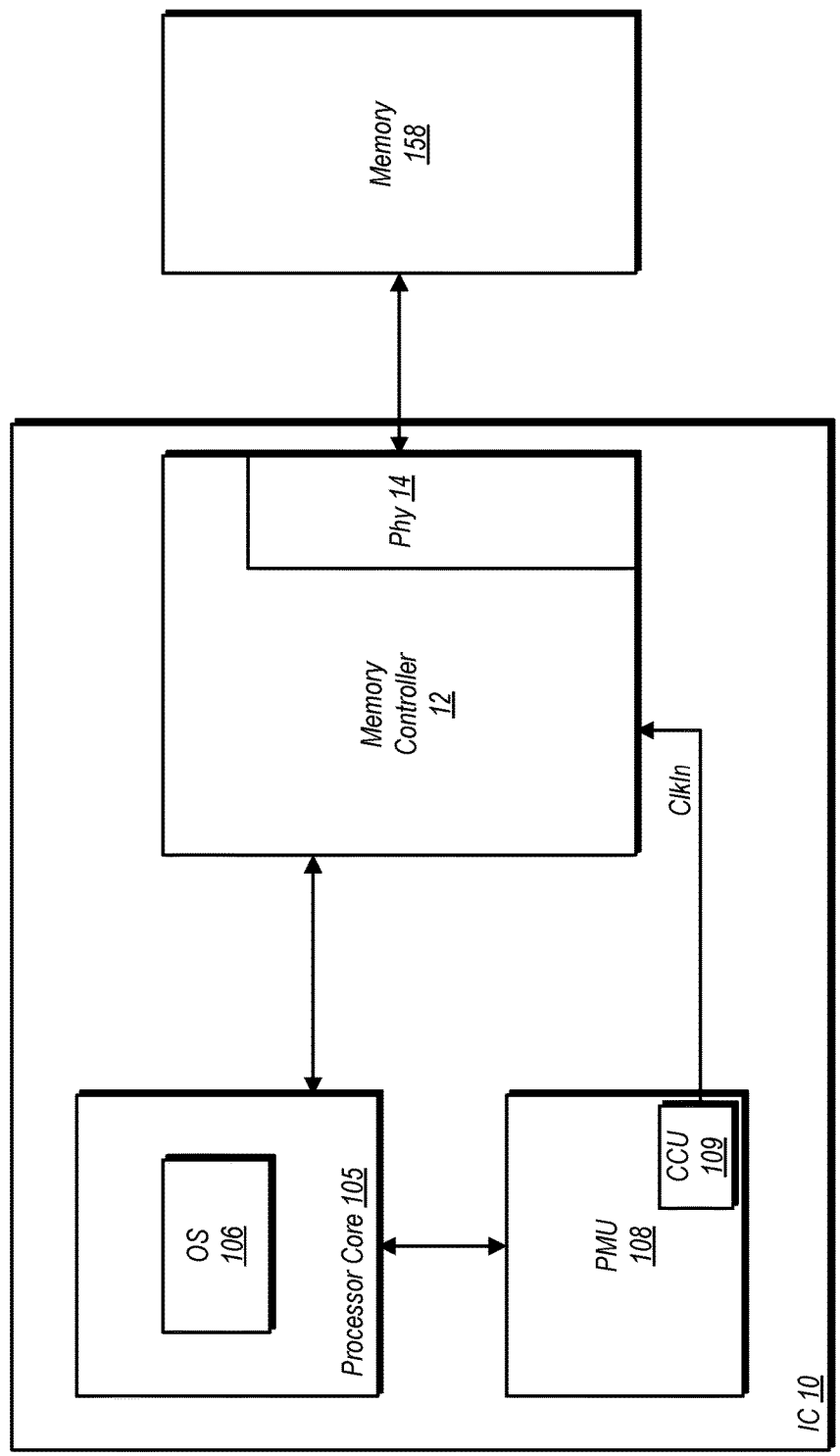
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may when executed, cause various system management functions to be performed such as memory allocation, performance state changes, and so forth.

IC 10 also includes a power management unit (PMU) 108 in the illustrated embodiment. PMU 108 may implement circuitry that performs various power control functions, such as supply voltage changes, power gating, clock frequency changes, and clock gating. These power control functions may be performed in conjunction with performance state changes. Such performance state changes may be put into effect via execution of instructions of OS 105 or through other mechanisms within PMU 108 itself.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

Figure 2:
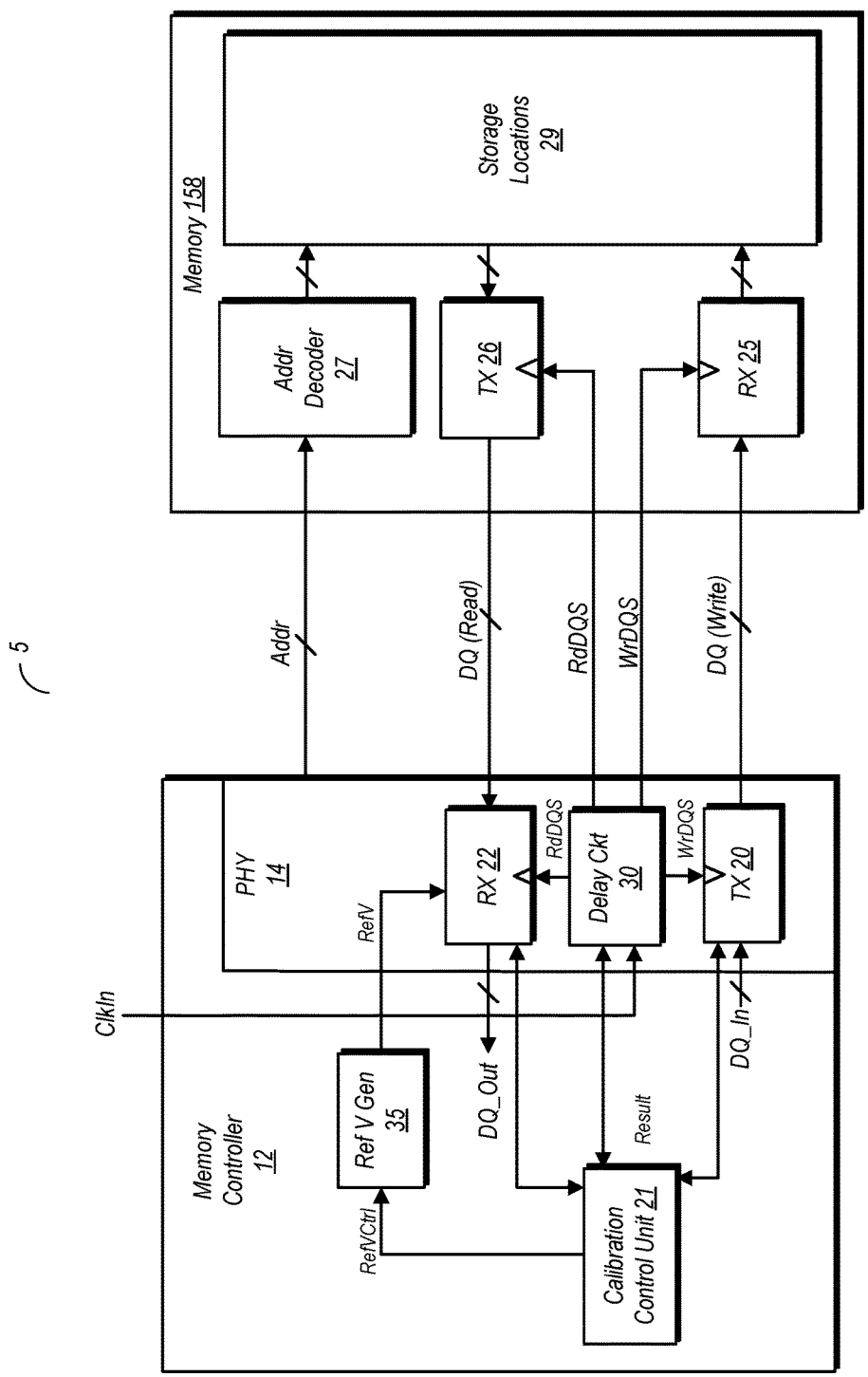
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes a calibration control unit 21, which may conduct various calibrations in the memory subsystem, as will be discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be accessed for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, calibration procedures may be performed at certain times during operation of memory controller 12 in order to optimize the point in time at which the data strobe signals sample data and involve performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage which is used to distinguish between a logic zero and a logic 1. Over time, due to process, voltage, and temperature variations, the reference voltage may need to be calibrated. This calibration may also be performed periodically, and may sometimes be referred to as a vertical calibration. Based on the calibration, calibration control unit may set the reference voltage at reference voltage generator 35 using the signal RefVCtrl. The reference voltage, RefV, or an indication of the same, may be provided from reference voltage generator 35 to receiver 22.

The calibration procedures may be conducted under the control of calibration control unit 21. A calibration includes performing multiple iterations of writing data to memory, reading the data back from memory, and comparing the read data to the written data. Writes and reads of data for calibrating the data strobe delay may include a performing writes and reads at number of different delay values. Writes and reads for calibrating the reference voltage may include performing a number of different writes and reads at different reference voltage values.

Upon performing a calibration, calibration control unit 21 may determine the parameters of an eye opening based on the calibrated values of the data strobe delay and the reference voltage. As the data bus (DQ) has a number of bit positions from which data is received and read, the parameters of an eye opening may be determined for each. Accordingly, calibration control unit 21 includes functionality (e.g., circuitry) for determining an eye opening for each bit position during each iteration of a performed calibration. Information obtained from the eye openings for each bit may be used in subsequent calibrations, as discussed in further detail below. When utilizing information based on an eye opening calibration control unit 21 may, in one embodiment, rely on an average eye opening for all bits. In another embodiment, calibration control unit 21 may rely on a bit having the smallest eye opening as a basis for further operations.

In one embodiment, the horizontal and vertical calibrations may be performed at the same periodic intervals, with one being performed on an interval just after completing the other. The vertical calibration may require a significantly greater amount of time to complete than the horizontal calibration, as the vertical calibration includes a number of different horizontal calibrations performed at different reference voltages. The greater amount of time required to perform the vertical calibration can reduce the overall system performance, since the memory is not available for normal transactions during this time. Furthermore, if performance state changes occur in conjunction with a vertical calibration, operation in the new performance state may be delayed. Accordingly, calibration control unit 21 may be configured to conditionally inhibit performance of the vertical calibration. In one embodiment, a reference score may be computed based on parameters of one or more of the eye openings determined during a previous calibration. During a current iteration of a calibration, the horizontal calibration may be performed first, using the previously calibrated value of the reference voltage. A score may be determined based the on the width of an eye opening from the current iteration of the horizontal calibration. The width of the current eye opening may be compared to a minimum eye opening width, while the score may then be compared to the reference score that was determined previously when both the data strobe delay and reference voltage were calibrated. If the width of the eye exceeds the minimum width threshold, and the score is within a specified range of the reference score, the vertical calibration may be inhibited. In one exemplary embodiment, if they current eye opening width exceeds the minimum and the score is within a range of ±5% of the reference score, the vertical calibration is not performed in the current iteration. Instead, the results of the horizontal calibration are applied (e.g., setting delay elements to provide delay to the data strobe per the horizontal calibration performed in the current iteration). Otherwise, if the score is not within the specified range or the width of the eye opening is less than the minimum threshold, the vertical calibration is performed on the current iteration. On iterations in which the vertical calibration is performed, the reference score may be updated accordingly and used as a basis for comparison in future iterations of the calibration procedure. As will also be discussed below, the history of whether a vertical calibration was performed during a particular iteration, or calibration cycle, may be recorded and used as a basis for determining the timing of subsequent calibrations.

Conditional performing (or inhibiting) the vertical calibration may save a significant amount of calibration time. This may be useful when variation in the eye openings from one iteration to the next is small, if not negligible. Eliminating a significant number of vertical calibration iterations may increase the availability of the memory subsystem. This in turn may increase the performance per watt of the memory subsystem, as more time may be spent performing memory operations that are related to normal system operation rather than explicitly tied to calibration operations. However, the vertical calibration may be performed when indicated as warranted based on specified conditions. Accordingly, a balance may be achieved between keeping the reference voltage at a calibrated value while increasing the amount of time that the memory is available for normal operations.

Figure 3:
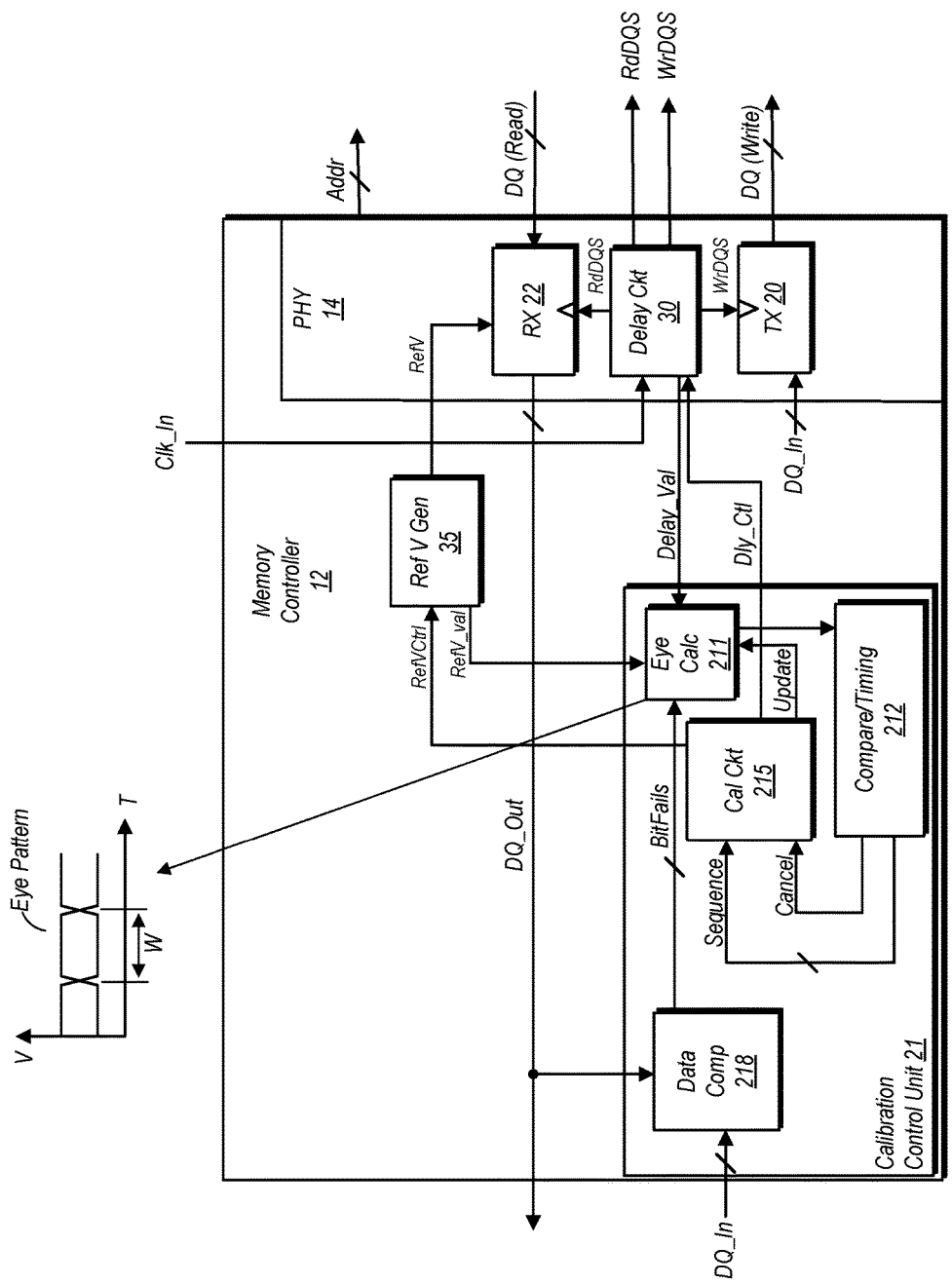
FIG. 3 is a block diagram illustrating one embodiment of a memory controller having a calibration control unit.

FIG. 3 further illustrates one embodiment of a memory controller having a calibration control unit. In the embodiment shown, calibration control unit includes a calibration circuit 215, an eye calculation circuit 211, a score calculation and a comparison/timing (CT) circuit 212, and a data comparison circuit 218.

During calibration operations, the data comparison circuit 218 may receive data that is to be written to the memory via the DQ_In input. Data that is read from memory may be received by data comparison circuit 218 from receiver 22, via the DQ Out path. The data read from memory may then be compared to data that was written to determine if any bit fails (i.e. bits in particular positions in which the read data and write data do not match in logical value). Bit fails ('BitFails' as shown in the drawing), may be reported to eye calculation circuit 211 as they occur. Responsive to receiving information of a bit fail, eye calculation circuit 211 may record the failing bit along with the reference voltage value and the delay value (as applied to the data strobe). Based on the data from failing bits and corresponding reference voltage and delay values, eye calculation circuit 211 may calculate an eye opening for each bit position. The eye opening data may then be forwarded to CT circuit 212.

During calibrations in which both the data strobe delay and the reference voltage are calibrated, CT circuit 212 may calculate and update the reference score. The reference score may be determined based on the width of an eye opening using one of a number of different methodologies. In one embodiment, an average width of the eye opening for all bits may be computed and used as the reference score. In another embodiment, an eye opening having the lowest width for all bits may provide the basis for the reference score. In yet another embodiment, an eye opening for a selected bit (e.g., designated as a worst-case bit) may serve as the basis for the reference score.

During subsequent calibrations, the data strobe delay may be calibrated first, using the most recently calibrated value of the reference voltage. Based on the calibrated delay and the most recently calibrated reference voltage value, eye calculation circuit 211 may calculate eye openings and forward the data to CT circuit 212. A score may then be calculated and compared to the reference score. Additionally, the width of the eye opening may be compared to a minimum width threshold. The results of these two comparisons may be combined into a single result indicating whether the reference voltage calibration is to be canceled for the current iteration. In the embodiment shown, the 'Cancel' signal is asserted if the reference voltage calibration is to be canceled for the current iteration. The calibration circuit 215 may receive the asserted 'Cancel' signal and inhibit performance of the reference voltage calibration. If the 'Cancel' signal is not asserted during a particular calibration iteration, the reference voltage calibration is performed during that iteration.

Calibration circuit 215 in the embodiment shown may assert an update signal, 'Update', during iterations that the vertical calibration is performed. This update signal, when received as asserted, may trigger eye calculation circuit to re-calculate the reference score.

CT circuit 212 may also provide information on calibration sequences to be performed by calibration circuit 215, via the path labeled 'Sequence'. CT circuit 212 in the embodiment shown includes a sequence table having a number of entries. Each entry stores a code indicating a sequence of calibrations to be performed during a given iteration. For example, in addition to the calibrations previously discussed herein, other calibrations may also be performed in conjunction therewith. For example, delay circuit 30 may include one or more DLL's for which calibrations may be performed. Accordingly, the information provided from the sequence table to the calibration circuit 215 may indicate which calibrations are to be performed, as well as the order thereof. It is noted that the sequence of calibrations may be as little as performing one calibration (e.g., data strobe delay). Furthermore, a code provided from the sequence table may also indicate a conditional reference voltage calibration, i.e. the reference voltage calibration is performed based on certain conditions not being met, such as those discussed above. Some sequences may also specify an unconditional reference voltage calibration, i.e. a reference voltage calibration is performed even if the conditions for inhibiting a conditional performance of the reference voltage calibration are otherwise met.

It is noted that while the functions performed by calibration control unit 21 have been described as having been carried out by circuitry, embodiments are possible and contemplated in which at least some of the functions are carried out by software and/or firmware. It is further noted that while both read data strobe and write data strobe signals have been disclosed, the discussion below focuses on a singular data strobe signal. This singular data strobe signal may be interpreted as the read data strobe or the write data strobe. Furthermore, the methodology discussed herein may apply to either of the data strobe signals disclosed herein, and the circuitry for performing the same may be re-configured to reflect such embodiments.

Figure 4:
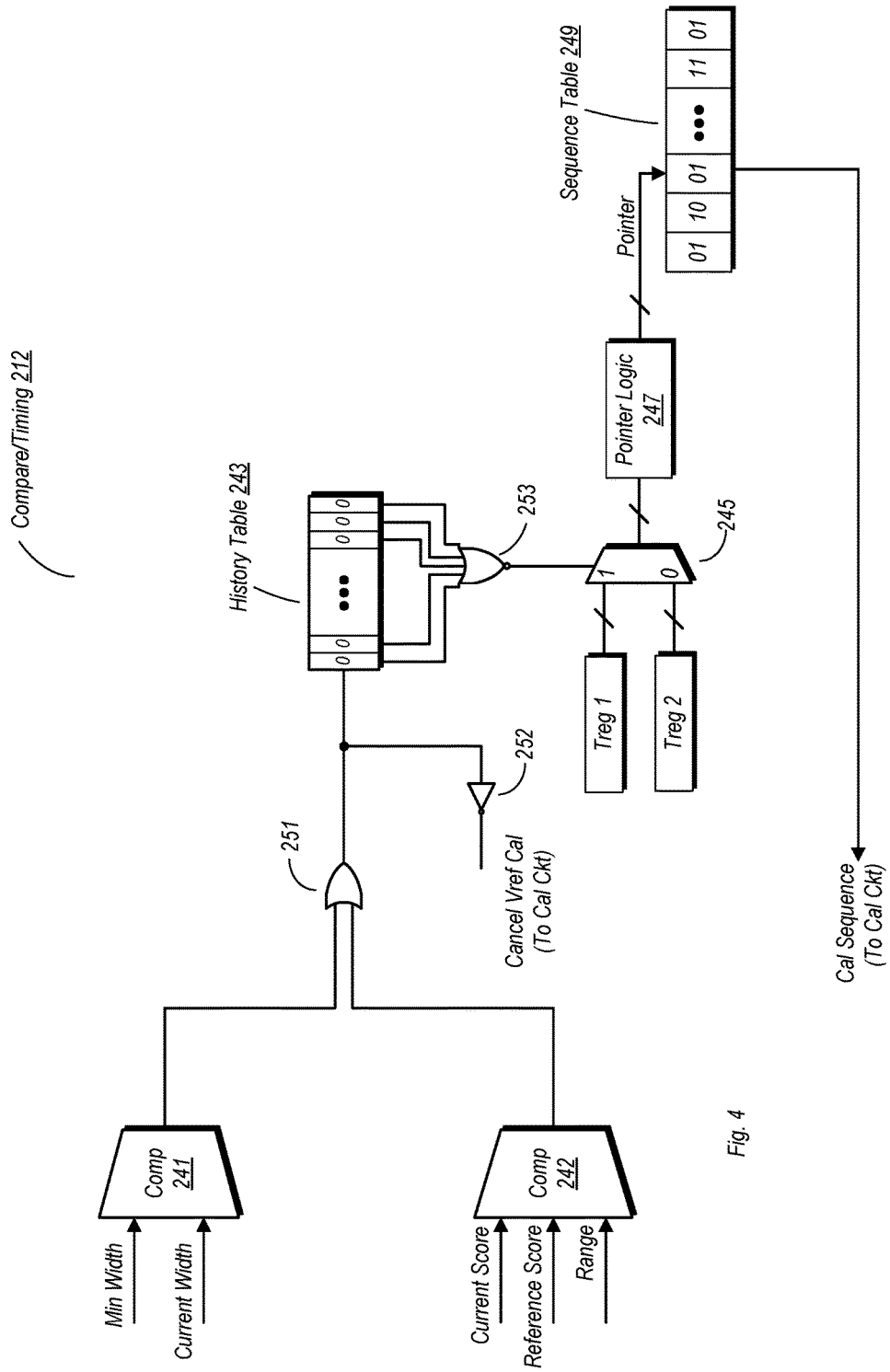
FIG. 4 is a block diagram illustrating further details for one embodiment of a calibration control unit.

FIG. 4 illustrates further details of one embodiment of a calibration control unit. In the embodiment shown, CT circuit 212 includes comparators 241 and 242. Comparator 241 in the embodiment shown is coupled to receive a minimum width value and a current eye opening width value. The minimum width value, which corresponds to a minimum eye opening width threshold, may be a programmable value and may be stored in a register that is within CT circuit 212, or external thereto. The current eye opening width may be received from eye calculation circuit 211. In this embodiment, comparator 241 will output a logic zero if the current width of the eye opening meets or exceeds the minimum width threshold. Otherwise, if the current width of the eye opening is less than the minimum threshold, comparator 241 will output a logic 1.

Comparator 242 in the embodiment shown is coupled to receive three different input values. A first of these is a current score value, which is based on the current eye opening width. A second input into comparator 242 is the reference score determined during the most recent iteration in which both the horizontal (delay) and vertical (reference voltage) calibrations were performed. The third input into comparator 242 is a range value. Like the minimum width value, the range value may be programmable and may be stored in a register internal or external to CT circuit 212. The range value may be input as a percentage of variation from the reference score. For example, the range input may be ±5%, indicating that one of the conditions to avoid performing the reference voltage calibration is that the current score be within 5% of the reference score.

Based on the range and reference score inputs, comparator 242 may determine upper and lower thresholds for comparison with the current score. If the current score is above the lower threshold and less than the upper threshold, it may thus be considered to be within the specified range. If the current score is within the specified range, comparator 242 may output a logic zero. Otherwise, if the current score is not within the specified range, comparator 242 may output a logic 1.

The respective outputs from comparators 241 and 242 may be provided to OR gate 251. Inverter 252 includes an input coupled to the output of OR gate 251. The output of inverter 252 is coupled to calibration circuit 215. If both of comparators 241 and 242 output a logic zero, OR gate 251 outputs a logic zero and inverter 251 outputs a logic one. When inverter 251 outputs a logic one, the 'Cancel' signal is asserted, and the calibration circuit 215 may respond by canceling the reference voltage calibration. Otherwise, if at least one of comparators 241 and 242 output a logic one (thus causing OR gate 251 to output the same), inverter 252 outputs a logic zero. During a given calibration cycle, if calibration circuit 251 does not receive a logic one from the output of inverter 252 after some predetermined time, it may perform the reference voltage calibration if a conditional reference voltage calibration was scheduled on that cycle.

The output of OR gate 251 is also coupled to history table 243. In the embodiment shown, history table 243 is implemented as a first-in first-out (FIFO) memory, with each entry storing one bit. A logic zero in an entry in the illustrated embodiment indicates the calibration results did not differ significantly from those to which they were compared (and thus, that any conditionally scheduled reference voltage calibration was canceled for the corresponding calibration cycle). A logic one in an entry indicates that the calibration results differed from those to which they were compared, or that the eye width was less than the minimum. A logic one may also indicate that if reference voltage calibration was performed if it conditionally scheduled in the sequence corresponding to that entry. History table 243 includes N entries (where N is an integer), and thus, stores the history of the last N calibration cycles with regard to whether the calibration results differed within prescribed limits and that the eye opening was of sufficient width during those cycles. History table 243 may be updated during each calibration cycle, with the oldest entry being evicted and the newest entry recording whether the reference voltage calibration was recorded for the current calibration cycle.

History table 243 in the embodiment shown is coupled to NOR gate 253. NOR gate 253 in this embodiment is an N-input NOR gate with each input coupled to a corresponding unique one of the entries of the FIFO that implements history table 243. The output of NOR gate 253 is coupled to a select input to multiplexer 245. The data inputs to multiplexer 245 are coupled to timing registers, Treg 1 and Treg 2. These registers store programmable timing values that are used to set the intervals between calibrations (by advancing a pointer, as explained below). One of these registers may store a relatively short timing value that corresponds to performing calibrations more frequently. The other register may store a longer timing value corresponding to less frequent performance of calibrations.

Depending on the information in the history table, one of these registers is selected and thus its information is passed along to pointer logic 247. In this particular embodiment, Treg1 stores the longer timing value, and is selected if each entry in history table 243 is a logic zero. The shorter timing value stored in Treg2 is selected if one or more of the entries in history table 243 is a logic one, indicating that the reference voltage calibration was performed within the last N calibration cycles. For example figures, the long timing value stored in Treg1 may be 200 ms, while the shorter timing value stored in Treg2 may be 100 ms. When system conditions permit the longer timing value, both power savings and increased memory bandwidth availability may be realized. The power savings may be realized by not only forgoing the reference voltage calibrations, but generally performing calibrations less frequently. The increased bandwidth availability may be realized by calibrating less frequently.

The timing value output from multiplexer 245 may be received by pointer logic 247. Pointer logic 247 may include timing logic that sets the rate at which the pointer is advanced. In other words, pointer logic 247 may set the interval by which the pointer moves from one entry to the next. Using the exemplary figures given above, the pointer may advance every 200 ms when using the longer interval, and every 100 ms when using the shorter interval.

Each time the pointer is advanced by pointer logic 237 in the illustrated embodiment, sequence table 249 outputs the sequence information in the newly selected entry to calibration circuit 215. Providing the sequence information to calibration circuit 215 may cause an initiation of one or more calibration procedures in accordance with the provided information. The entries in this example of sequence table 249 each include two bits, and thus up to four different calibration sequences are possible. However, this embodiment is not limiting, and the number of bits in each entry may and thus the number of possible sequences may vary from one embodiment to the next.

It is noted that while the illustrated embodiment has two possible timing intervals, embodiments with a great number are possible and contemplated. Accordingly, in such embodiments, additional timing registers or other types of circuitry for storing timing information may be implemented. Similarly, multiplexers having more than two inputs may be implemented in such embodiments.

Figure 5:
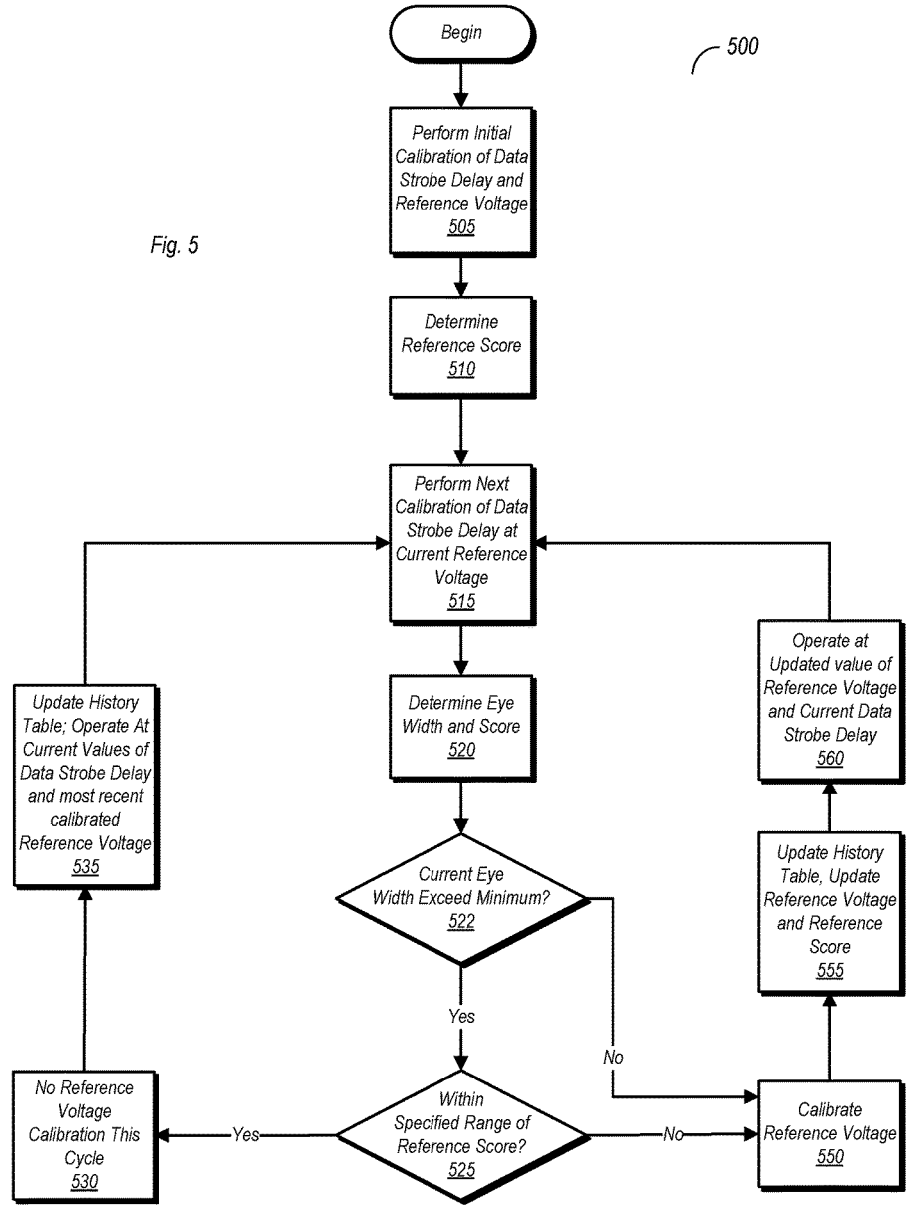
FIG. 5 is a flow diagram illustrating one embodiment of a method for performing periodic calibrations of a memory subsystem.

FIG. 5 if a flow diagram illustrating one embodiment of a method for calibrating a memory subsystem. Method 500 may be implemented using various embodiments of the apparatus discussed above and shown in FIGS. 1-4. Furthermore, apparatus embodiments not explicitly discussed herein that are capable of performing method 500 are also possible and contemplated. The data strobe discussed in the context of FIG. 4 may be a read data strobe (e.g., RdDQS of FIGS. 2 and 3) or a write data strobe (e.g., WrDQS of FIGS. 2 and 3).

Method 500 begins with the performing of an initial calibration, which includes calibrating a data strobe delay and a reference voltage (block 505). Based on the calibrated values of the data strobe delay and reference voltage, eye openings are determined and a reference score is calculated (block 510). The reference score is based on eye openings for one or more bit positions of the data that is written to and read from memory during performance of the calibration.

Each calibration of the data strobe includes performing multiple reads and writes at different delay values. Each calibration of the reference voltage include performing multiple reads and writes at different reference voltage values, and may further be characterized as performing a number of horizontal calibrations at different reference voltage values.

The reference score may be based on an eye opening for at least one bit, and in some cases for multiple bits. For example, reference score may be determined from an average width of an eye opening for all bits. Alternatively, the reference score may be determined from an eye opening with the smallest width. Other methodologies for determining the reference score are also possible and contemplated. In general, any suitable method of determining the reference score may be used with method 400.

After performance of the initial calibration, a next calibration is performed in accordance with a selected periodic interval (block 515). The next calibration may include a conditional reference voltage calibration, an unconditional reference voltage calibration, or no reference voltage calibration. In the next calibration, the data strobe delay is calculated, while using the most recent previously calibrated value of the reference voltage. Based on the previous reference voltage and the data strobe delay calibrated in the current cycle, a current eye width and a current score are s determined (block 520). The score may be determined on the same basis as that upon which the reference score was determined. Thereafter the current width of the eye opening may be compared to a predetermined minimum. If the current eye width is less than the minimum width (block 522, no), the method proceeds to block 550, and a reference voltage calibration is performed if scheduled conditionally. If the current eye width meets or exceeds the threshold (block 522, yes), the method advances to block 525, where it is determined if the current score is within the specified range of the reference score. If the current score is within the specified range of the reference score (block 525, yes), then the method advances to block 530, and the reference voltage calibration is canceled if it were indicated as conditional in the currently selected entry of the sequence table. Otherwise, if the reference score is not within the specified range (block 525, no), the reference voltage calibration is performed per block 550 if it were otherwise scheduled on a conditional basis.

If the reference voltage calibration is not performed (block 530) the system may continue operation at the current value of the data strobe delay and previously calibrated value of the reference voltage (block 535). The history table may also be updated at this time to indicate that the calibration results differed only within prescribed limits and that the eye opening was of sufficient width the current calibration cycle (thereby resulting in cancellation of the reference voltage calibration). The method then returns to block 515 for the next calibration cycle, which may occur in accordance with the selected timing interval.

If the reference voltage calibration is performed (block 550), then the reference voltage and reference scores are both updated, (block 555). The history table may also be updated at this time with an indication that the reference voltage calibration was performed during the current cycle. Thereafter operation continues with the currently calibrated reference voltage and data strobe delay values (block 560) before returning to block 515 for the next calibration cycle.

It is noted that method 500 is primarily applicable to instances in which the reference voltage calibration is conditionally scheduled. In some instances, a sequence provided by the sequence table may indicate that the reference voltage calibration is to be performed unconditionally. Furthermore, some instance, the sequence provided by the sequence table may indicate, unconditionally, that the reference voltage is not to be performed. The comparisons based on the reference score and eye width threshold may be performed (and corresponding history recorded) irrespective of whether the reference voltage calibration is unscheduled, conditionally scheduled, or unconditionally scheduled.

Figure 6:
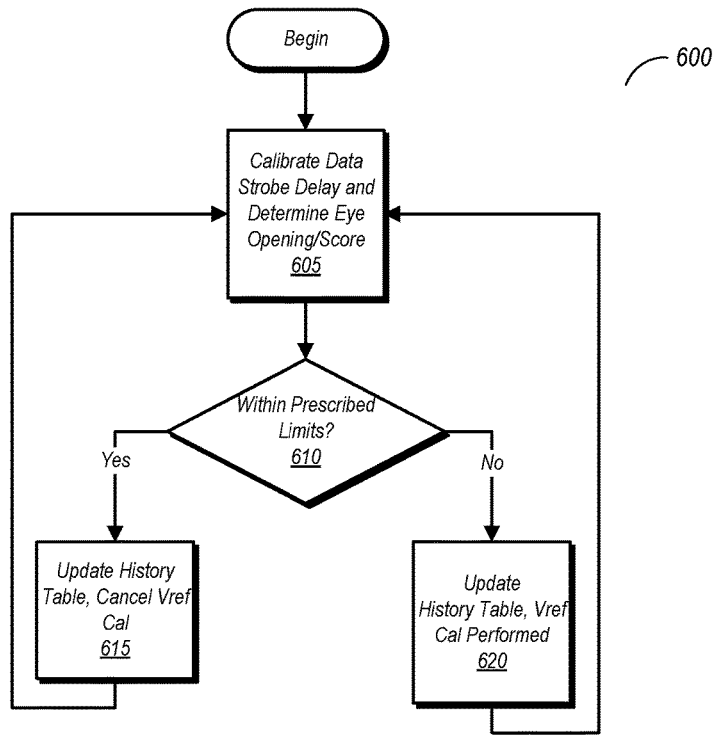
FIG. 6 is a flow diagram illustrating one embodiment of a method for updating a history table.

FIG. 6 is a flow diagram illustrating one embodiment of a method for updating a history table. Like method 500, method 600 may be performed with any of the various hardware embodiments discussed above, as well as others not explicitly discussed herein. Furthermore, it is possible and contemplated that method 500 could be performed with any combination of software, firmware, and/or hardware, and such embodiments are thus considered to fall within the scope of this disclosure.

Method 600 begins with the calibration of a data strobe delay (block 605). This calibration may be performed during a cycle subsequent to one in which the reference score was previously determined. The width of the eye opening and a current score may be calculated following the calibration of the data strobe delay to determine if a reference voltage calibration is to be performed. If the calibration results were within prescribed limits (block 610, yes), the history table is update to indicate the same, and the reference voltage calibration is canceled (block 615). If the calibration results were not within prescribed limits (block 610, no), then the history table is updated to reflect that, and the reference voltage calibration is performed for the current cycle (block 620). Irrespective of the path taken at block 610, the method returns to block 605 for the next calibration cycle after updating the history table.

Figure 7:
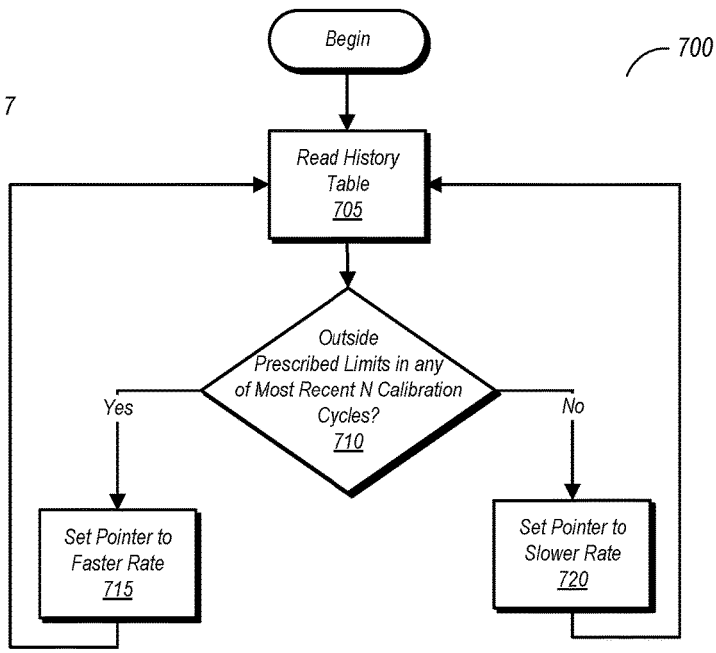
FIG. 7 is a flow diagram illustrating one embodiment of a method for adapting the timing at which calibrations are performed.

FIG. 7 is a flow diagram illustrating one embodiment of a method for adapting the timing at which calibrations are performed. Like methods 500 and 600 discussed above, method 700 may be performed with any of the various hardware embodiments discussed above, as well as others not explicitly discussed herein. Furthermore, it is possible and contemplated that method 500 could be performed with any combination of software, firmware, and/or hardware, and such embodiments are thus considered to fall within the scope of this disclosure.

Method 700 begins with the reading of the history table during a current calibration cycle (block 705). If the information in the history table indicates that the calibration results were outside prescribed limits in any of the most recent N calibration cycles (block 710, yes), the timer value is set to update the pointer position at a faster rate (block 715). If the information in the history table indicates that the calibration results were within prescribed limits for each of the most recent N calibration cycles, then the timer value may be set to update the pointer at the slower rate (block 720).

Figure 8:
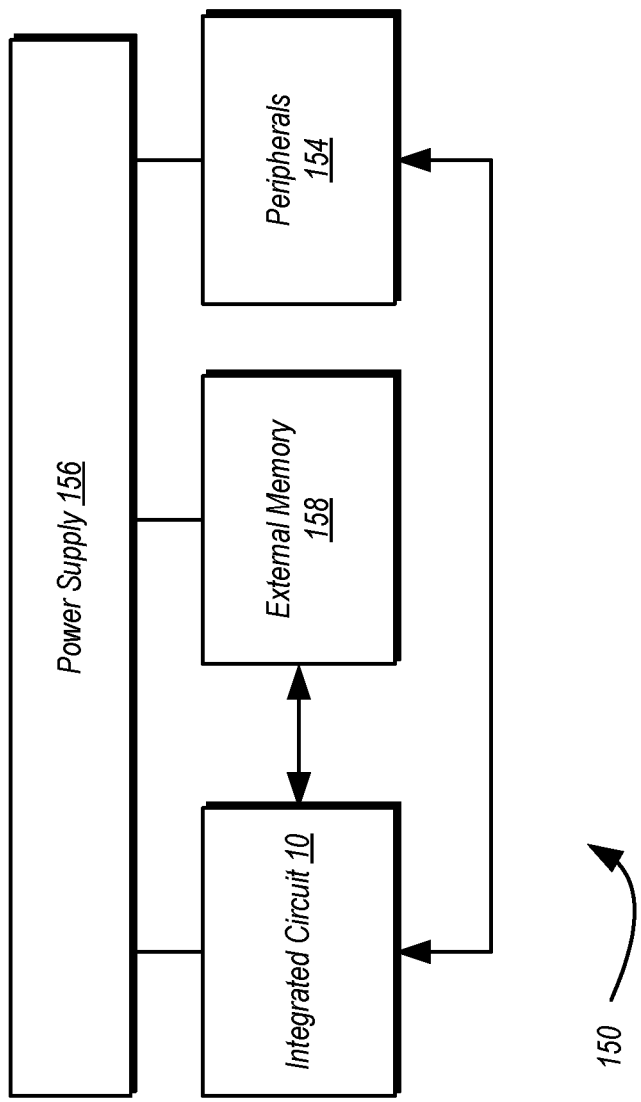
FIG. 8 is a block diagram of one embodiment of a system.

Turning next to FIG. 8, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a memory;
   a memory controller coupled to the memory, wherein the memory controller is configured to convey a data strobe signal to the memory during transfers of data between the memory and the memory controller, wherein the memory controller includes a calibration control circuit configured to:
   perform a current calibration of a delay applied to the data strobe signal;
   inhibit a conditional reference voltage calibration within the current calibration if a current score is within a specified range of a reference score and current width of an eye opening is at least equal to a minimum threshold, the eye opening being associated with the data strobe signal, and wherein the current and reference scores are based on corresponding widths of the eye opening;
   record, in a history table, that the current score was within the specified range and that the current width of the eye opening is at least equal to the minimum threshold;
   set timing of subsequent calibrations based on information stored in the history table; and
   on a next calibration cycle, perform a sequence of calibrations in accordance with a particular one of a plurality of entries in a sequence table to which a pointer is currently pointing.

2. The apparatus as recited in claim 1, wherein the calibration control circuit is configured, to perform the conditional reference voltage calibration within the current calibration if the reference score is not within the specified range or the current width of the eye opening is less than the minimum threshold, and further configured to record, in the history table, that the reference voltage calibration was performed for the current calibration.

3. The apparatus as recited in claim 1, further comprising:
   a timer, wherein the calibration control circuit is configured to set a timer value based on information stored in the history table, wherein the timer is configured to advance the pointer to the sequence table at a rate corresponding to the timer value.

4. The apparatus as recited in claim 3, wherein the timer is configured to:
   advance the pointer at a first rate responsive to the history table indicating that, in a most recent N calibration cycles, each corresponding score was within the specified range of the reference score and each measured width of the eye opening was at least equal to a minimum threshold; and
   advance the pointer at a second rate responsive to the history table indicating that one or more corresponding scores was not within a specified range of a reference score, one or more measured eye opening widths were less than the minimum threshold, or both;
   wherein the first rate is slower than the second rate.

5. The apparatus as recited in claim 1, wherein the calibration control circuit is configured to perform an initial calibration of the data strobe delay and the reference voltage, and further configured to determine a width of an eye opening and a corresponding reference score based on the initial calibration.

6. The apparatus as recited in claim 1, wherein the calibration control circuit includes an eye calculation circuit configured to calculate the current width of the eye opening.

7. The apparatus as recited in claim 1, wherein the calibration control circuit is configured to:
   cause multiple writes to and reads from memory to be performed at different values of data strobe delay during the performance of a data strobe delay calibration;
   cause multiple writes to and reads from memory to be performed a different values of the reference voltage during performance of a reference voltage calibration.

8. A method comprising:
   performing, using a calibration control circuit, a current calibration of a delay applied to a data strobe signal in a memory subsystem, the memory subsystem having a memory and a memory controller configured to convey the data strobe signal to the memory, wherein performing the current calibration includes determining a width of an eye opening associated with the data strobe;
   inhibiting, using the calibration control circuit, a conditionally scheduled calibration of a reference voltage for the current calibration if a current width of the eye opening meets or exceeds a minimum width threshold and a current score is within a specified range of a reference score, the current and reference scores being based on corresponding widths of the eye opening;
   recording, in a history table and using the calibration control circuit, that the current width of the eye opening was at least equal to the minimum threshold and that the reference score was within the specified range;
   setting, using the calibration control circuit, timing of subsequent calibrations based on information stored in the history table; and
   performing, using the calibration circuit, a sequence of calibrations in accordance with information stored in a one of a plurality of entries in a sequence table to which a pointer is pointing.

9. The method as recited in claim 8, wherein setting the timing of subsequent calibrations comprises setting a value of a timer based on the information stored in the history table, wherein the method further comprises:
   storing, in the sequence table, a plurality of entries each indicating a sequence of calibrations to be performed;

advancing, using the timer, the pointer to the sequence table at a rate corresponding to the timer value.

10. The method as recited in claim 9, further comprising:
the history table indicating which, if any, of a most recent previous N calibration cycles resulted in both a corresponding eye opening width was at least equal to the minimum threshold and a corresponding score was within the specified range;
the timer advancing the pointer at a first rate responsive to the history table indicating that both the corresponding eye opening width was at least equal to the minimum threshold and a corresponding score was within the specified ranged for each of the most recent previous N calibration cycles; and
the timer advancing the pointer at a second rate responsive to the history table indicating that either the corresponding eye opening width was less the minimum threshold, the corresponding score was not within the specified ranged, or both, for at least one of the most recent previous N calibration cycles;
wherein the second rate is greater than the first rate.

11. The method as recited in claim 8, further comprising performing the conditionally scheduled calibration if at least one of the following is true:
the current score is not within the specified range of the reference score;
the current width of the eye opening is less than the minimum threshold.

12. The method as recited in claim 8, further comprising:
performing, using the calibration control circuit, an initial calibration;
determining an initial width of the eye opening based on results from the initial calibration;
determining the reference score based on the initial width of the eye opening; and
determining the specified range based on the reference score.

13. The method as recited in claim 8, wherein performing a calibration of the data strobe delay comprises the calibration control circuit causing writes to and reads from memory to be performed at different values of delay, and wherein performing calibration of the reference voltage comprises the calibration control circuit causing writes to and reads from memory to be performed at different values of the reference voltage.

14. A system comprising:
a memory subsystem including a memory and a memory controller, wherein the memory controller is configured to synchronize data transfers to and from the memory using a data strobe signal, and wherein the memory controller includes:
a calibration control circuit configured to perform a current calibration of a delay applied to the data strobe signal, and further configured to determine a current width of an eye opening associated with the data strobe signal based on results of the current calibration; and
comparison circuitry, wherein the calibration control circuit is configured to inhibit performing a conditional reference voltage calibration during the current calibration responsive to the comparison circuitry determining that the current width of the eye opening is greater than minimum threshold and that a current score is within a specified range of a reference score, the current score being based on the current width of the eye opening and the reference score being based on a previous width of the eye opening;
a history table, wherein the calibration control circuit is configured to record in the history table during each calibration cycle, whether both the current score was within the specified range of the reference score and the current width of the eye opening was greater than the minimum threshold;
a timer configured to set a time interval based on information stored in the history table;
a sequence table having a plurality of entries, each of the plurality of entries indicating a sequence of calibration procedures to be performed, wherein the timer is configured to advance a pointer to the sequence table at a rate dependent on the information stored in the history table.

15. The system as recited in claim 14, wherein the timer is configured to:
advance the pointer at a first rate if the information stored in the history table indicates that in each of a most recent N calibration cycles, a corresponding score was within the specified range of the reference score and that a corresponding eye opening width exceeded the minimum threshold; and
advance the pointer at a second rate greater than the first rate if the information stored in the history table indicates that in one or more of the most recent N calibration cycles, the corresponding score was not within the specified range, the corresponding eye opening width was less than the minimum threshold, or both.

16. The system as recited in claim 14, wherein the calibration control circuit is configured to calibrate the reference voltage in the current calibration cycle if one or more of the following is true:
the reference voltage calibration is conditionally scheduled and either the current score is not within the specified range of the reference score, the current width of the eye opening is less than the minimum threshold, or both;
the reference voltage calibration is unconditionally scheduled.

17. The system as recited in claim 14, wherein the calibration control circuit is configured to perform an initial calibration that includes calibrating the data strobe delay and calibrating the reference voltage, and further includes determining an initial width of the eye opening, wherein the reference score and the specified range are determined based on the initial width of the eye opening.

* * * * *